(12) United States Patent
Haetty

(10) Patent No.: US 7,170,797 B2
(45) Date of Patent: Jan. 30, 2007

(54) TEST DATA TOPOLOGY WRITE TO MEMORY USING LATCHED SENSE AMPLIFIER DATA AND ROW ADDRESS SCRAMBLING

(75) Inventor: Jens Haetty, Essex Junction, VT (US)

(73) Assignee: Infineon Technologies AG, Munich (DE)

( * ) Notice: Subject to any disclaimer, the term of this patent is extended or adjusted under 35 U.S.C. 154(b) by 78 days.

(21) Appl. No.: 11/046,065

(22) Filed: Jan. 28, 2005

(65) Prior Publication Data
US 2006/0171220 A1    Aug. 3, 2006

(51) Int. Cl.
*G11C 7/00* (2006.01)

(52) U.S. Cl. .......................... 365/189.05; 365/189.01; 365/201; 365/222

(58) Field of Classification Search ................ 365/189.01–189.05, 201–202, 222
See application file for complete search history.

(56) References Cited

U.S. PATENT DOCUMENTS

| | | | |
|---|---|---|---|
| 5,301,299 A | * | 4/1994 | Pawlowski et al. ............ 711/5 |
| 7,032,119 B1 | * | 4/2006 | Fung ........................... 713/320 |
| 2006/0092736 A1 | * | 5/2006 | Rohleder ..................... 365/207 |

* cited by examiner

*Primary Examiner*—Tuan T. Nguyen
(74) *Attorney, Agent, or Firm*—Patterson & Sheridan, L.L.P.

(57) ABSTRACT

For one or more disclosed embodiments, a test data topology may be written to memory by writing data into an initial row of memory cells. The writing of data comprises latching data in a plurality of sense amplifier latches. The initial row of memory cells is deactivated while the latched data is retained in the sense amplifier latches. Another row of memory cells is identified in accordance with a predetermined row addressing sequence for the test data topology. The other row of memory cells is activated to write the retained latched data to the other row.

8 Claims, 10 Drawing Sheets

| REGION 1 | REGION 2 | REGION 3 | REGION 4 |
|---|---|---|---|
| RA<9>=0 | RA<9>=0 | RA<9>=1 | RA<9>=1 |
| 0 | 1 | 512 | 513 |
| 2 | 3 | 514 | 515 |
| 4 | 5 | 516 | 517 |
| 6 | 7 | 518 | 519 |
| 8 | 9 | 520 | 521 |
| 10 | 11 | 522 | 523 |
| ⋮ | ⋮ | ⋮ | ⋮ |

FIG. 9

| REGION 1 | REGION 2 | REGION 3 | REGION 4 |
|---|---|---|---|
| RA<9>=0 | RA<9>=0 | RA<9>=1 | RA<9>=1 |
| 0 | 2 | 512 | 514 |
| 1 | 3 | 513 | 515 |
| 4 | 6 | 516 | 518 |
| 5 | 7 | 517 | 519 |
| 8 | 10 | 520 | 522 |
| 9 | 11 | 521 | 523 |
| 12 | 14 | 524 | 526 |
| ⋮ | ⋮ | ⋮ | ⋮ |

FIG. 10

TEST DATA TOPOLOGY WRITE TO MEMORY USING LATCHED SENSE AMPLIFIER DATA AND ROW ADDRESS SCRAMBLING

BACKGROUND OF THE INVENTION

1. Field of the Invention

The invention generally relates to memory testing.

2. Description of the Related Art

One technique to test dynamic random access memory (DRAM) entails writing predetermined data to the memory, reading data from the memory, and identifying whether the read data matches the written data to help verify whether the memory functions properly. Different data topologies may be written to the memory to help detect various defects or faults (e.g., solids '1111', stripes '1010', etc.). Selection of appropriate test data topologies may depend, for example, on the defect(s) and/or fault(s) to be detected and the architecture of the memory.

To write a desired test data topology into memory, a tester issues WRITE commands to the memory, requiring the memory to perform a series of steps, for each row of memory cells to be tested. For example, the memory may perform a series of steps to activate a row of memory cells, sequentially address columns of memory cells to write data in accordance with the test data topology to memory cells common to the activated row and each addressed column, and deactivate the activated row to allow another row of memory cells to be accessed.

For various reasons (e.g., geometry, yield, and speed optimizations) memory devices often have physical memory topologies employing "scrambling" techniques where logically adjacent addresses and/or data are not physically adjacent. As a result, to achieve a desired effect of testing with a particular data topology, this scrambling must be taken into account, for example, by transforming (or mapping) sequential addresses into non-sequential addresses, as dictated by the particular scrambling circuitry used on the device, at the tester.

Unfortunately, compensating for scrambling in this manner complicates the development of test programs. Therefore, what is needed is a method and apparatus that facilitate the testing of memory devices utilizing scrambling.

SUMMARY OF THE INVENTION

One or more disclosed methods for writing data to memory in accordance with a test data topology comprise writing data into an initial row of memory cells, wherein the writing data comprises latching data in a plurality of sense amplifier latches, deactivating the initial row of memory cells while retaining the latched data in the sense amplifier latches, identifying another row of memory cells in accordance with a predetermined row addressing sequence for the test data topology, and activating the other row of memory cells to write the retained latched data to the other row.

One or more disclosed methods for writing data to memory in accordance with a test data topology comprise writing data into an initial row of memory cells of a region of memory cells, wherein the writing data comprises latching data in a plurality of sense amplifier latches, deactivating the initial row of memory cells while retaining the latched data in the sense amplifier latches, identifying another row of memory cells of the region in accordance with a predetermined row addressing sequence for the test data topology, activating the other row of memory cells of the region to write the retained latched data to the other row, deactivating the other row of memory cells while retaining the latched data in the sense amplifier latches, and repeating the identifying, activating, and deactivating of another row of memory cells of the region.

One or more disclosed apparatuses comprise one or more memory arrays having memory cells, a plurality of sense amplifier latches, addressing circuitry to address rows of one or more memory arrays in accordance with a predetermined row addressing sequence for a test data topology, and control circuitry to control writing data to an initial row of memory cells, retaining latched data in sense amplifier latches after deactivating the initial row, and activating another row of memory cells to write the retained latched data to the other row.

One or more disclosed apparatuses comprise one or more memory arrays having memory cells, means for writing data for a test data topology into an initial row of memory cells, means for deactivating the initial row of memory cells while retaining the data, means for identifying another row of memory cells in accordance with a predetermined row addressing sequence for the test data topology, and means for activating the other row of memory cells to write the retained data to the other row.

One or more disclosed systems comprise a wafer having an integrated circuit having one or more memory arrays having memory cells, a plurality of sense amplifier latches, addressing circuitry to address rows of one or more memory arrays in accordance with a predetermined row addressing sequence for a test data topology, and control circuitry to control writing data to an initial row of memory cells, retaining latched data in sense amplifier latches after deactivating an activated row, and writing the retained latched data to one or more other rows of memory cells. One or more disclosed systems also comprise a tester to issue to the integrated circuit one or more commands to write data to one or more memory arrays in accordance with the test data topology.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 9 illustrates, for one or more embodiments, an example sequence of cell field extracts in which common data is written to multiple rows of different regions in accordance with a row-C-double stripe data topology; and FIG. 10 illustrates, for one or more embodiments, an example sequence of cell field extracts in which common data is written to multiple rows of different regions in accordance with a row-single stripe data topology.

DETAILED DESCRIPTION

Embodiments of the invention generally provide writing data to memory in accordance with a test data topology using latched sense amplifier data and row address scrambling. Test data topography writes to memory for one or more embodiments may then be performed faster, allowing memories to be tested faster.

A memory device may include internal addressing circuitry that accounts for address scrambling by selecting row address sequences based on a particular test data topology (e.g., solid, stripes, etc.). As a result, during testing, a tester may simply generate addresses in sequence, while the internal addressing circuitry activates the rows in accordance with the address scrambling circuitry. Because the tester program does not need to account for the scrambling, tester program development may be greatly facilitated.

As used herein, the term scrambling generally refers to the utilization of addressing circuitry that results in logically adjacent memory cells that are not physically adjacent. In other words, in response to sequential addresses presented on address pins of a memory device (e.g., 0, 1, 2, . . . ) non-sequential rows may be activated as dictated by the scrambling circuitry (e.g., 0, 2, 4, . . . ). As used herein, the term row may be used interchangeably with the term wordline and generally refers to a conductive line used, in conjunction with intersecting bitlines, to select a plurality of memory cells.

An Exemplary Integrated Circuit Memory

Figure 1:
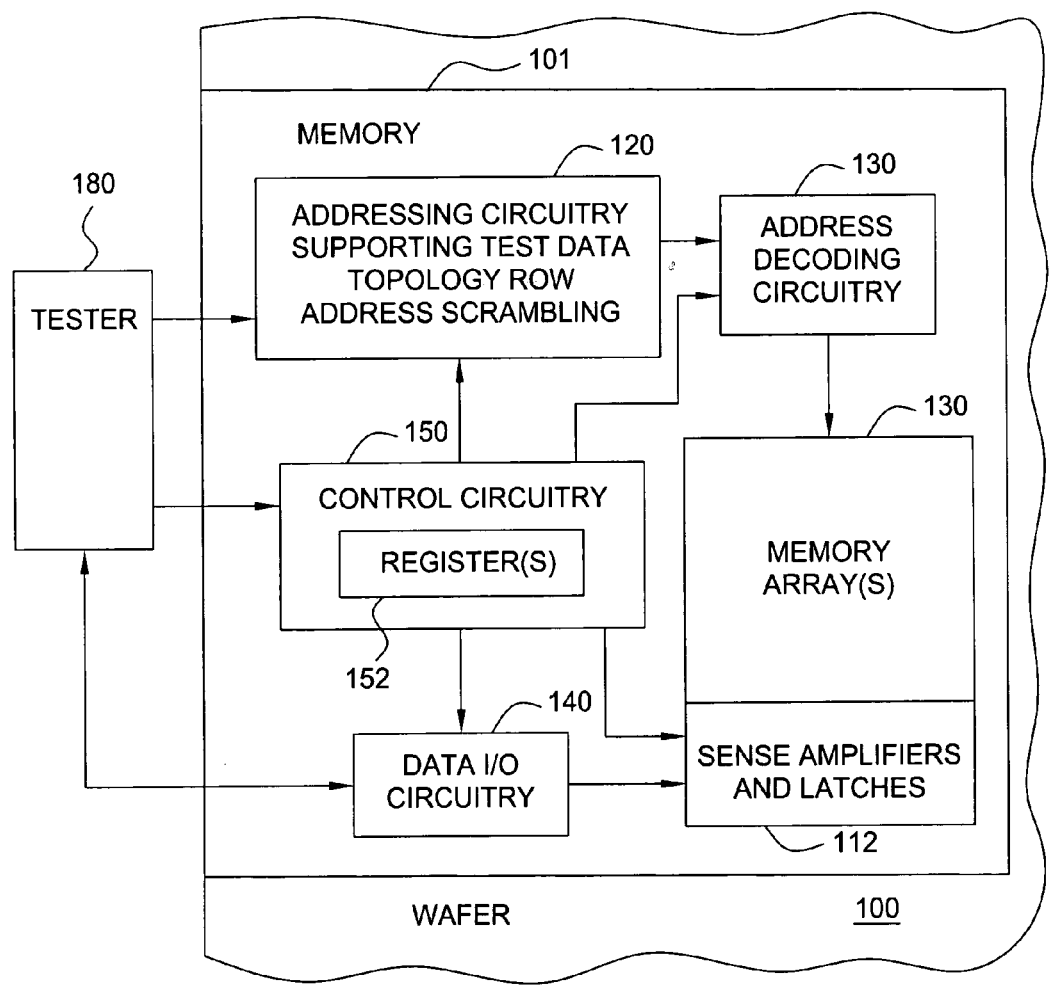
FIG. 1 illustrates, for one or more embodiments, a system comprising a tester and a wafer having a memory that supports test data topography writes using latched sense amplifier data and row address scrambling.

FIG. 1 illustrates, for one or more embodiments, an integrated circuit memory 101 on a wafer 100. Memory 101 for one or more embodiments, as illustrated in FIG. 1, may comprise one or more memory arrays 110, sense amplifiers and latches 112, addressing circuitry 120, address decoding circuitry 130, data input/output (I/O) circuitry 140, and control circuitry 150.

Memory array(s) 110 each have a plurality of memory cells. Sense amplifiers and latches 112 are coupled to read and write data to addressed memory cells of memory array(s) 110. Memory array(s) 110 and sense amplifiers and latches 112 may be configured in accordance with any suitable memory architecture, such as a suitable dynamic random access memory (DRAM) architecture for example.

Addressing circuitry 120 issues addresses identifying memory cells of memory array(s) 110 to be accessed, and address decoding circuitry 130 is coupled to receive addresses from addressing circuitry 120 and to provide access to memory cells of memory array(s) 110 by activating and deactivating rows and columns of memory cells of memory array(s) 110 in accordance with the received addresses. Data I/O circuitry 140 is coupled to transmit data to sense amplifiers and latches 112 to write data to memory array(s) 110 and to receive data from sense amplifiers and latches 112 to read data from memory array(s) 110. Control circuitry 150 controls sense amplifiers and latches 112, addressing circuitry 120, address decoding circuitry 130, and data I/O circuitry 140 to access memory cells of memory array(s) 110.

Addressing circuitry 120 is coupled to receive addresses input to memory 101. Data I/O circuitry 140 is coupled to receive data input to memory 101 and to transmit data to be output from memory 101. Control circuitry 150 is coupled to receive commands input to memory 101. Memory 101 may be coupled to any suitable external circuitry to receive commands, addresses, and/or data from and/or transmit data to such external circuitry to allow such external circuitry to access memory array(s) 110.

Memory 101 for one or more embodiments may be coupled to a tester 180 to allow tester 180 to help test the circuitry of memory 101. Tester 180 for one or more embodiments may help control memory 101 to perform any suitable test data topology write to help detect any suitable one or more defects and/or faults in memory array(s) 110 and/or sense amplifiers and latches 112.

For some embodiments, memory arrays may be divided into segments. The size and layout of a segment is generally defined by a group of sense amplifiers (e.g., commonly referred to as a "sense amp stripe") simultaneously activated by the activation of a single wordline in the array. In general, a segment refers to a physical location within the array. Segments may be further divided into regions. A region generally refers to a subgroup of rows within a segment whose logical connection to the sense amplifiers is identical.

In other words, an activation of rows of the same group results in the same physical data written to the cells (e.g., in a first region only cells connected to TRUE bitlines may be addressed while in a second region only cells connected to COMPLEMENT bitlines may be addressed). The number of regions within a segment may also be dependent on the bitline architecture used for a particular array design. The particular rows in a region may depend on the particular data topology selected.

Figure 2:
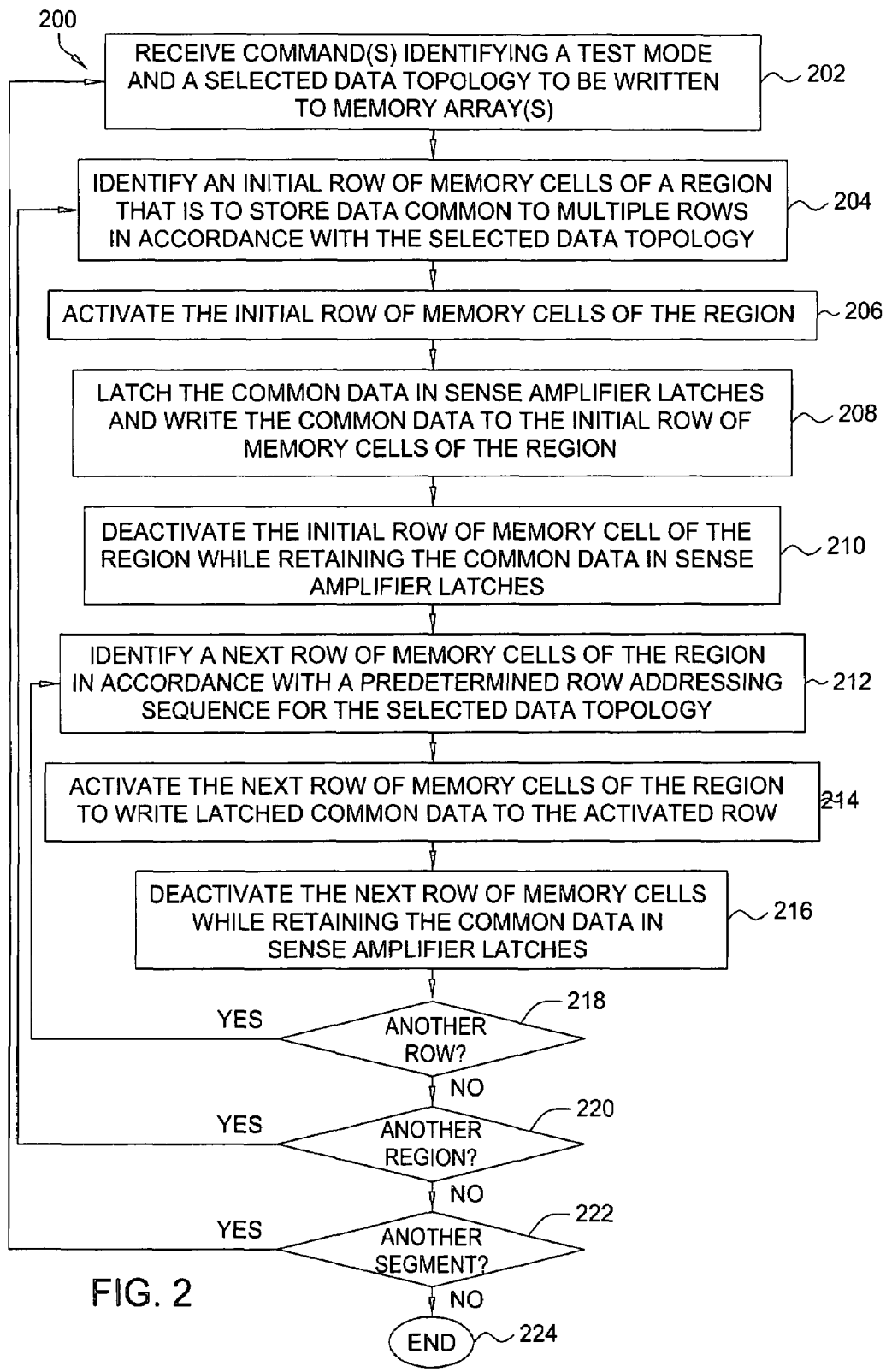
FIG. 2 illustrates, for one or more embodiments, a flow diagram to write data in accordance with a test data topography to memory using latched sense amplifier data and row address scrambling.

Memory 101 for one or more embodiments may perform a test data topology write in accordance with a flow diagram 200 of FIG. 2, utilizing this notion of segments and regions. For block 202 of FIG. 2, memory 101 receives one or more commands identifying a test mode and a selected data topology to be written to memory array(s) 110. For one or more embodiments, the identified test mode itself may identify the data topology to be written to memory array(s) 110. Memory 101 for one or more embodiments may be placed in the identified test mode in response to such command(s). Memory 101 for one or more embodiments may be configured in the identified test mode to retain latched sense amplifier data following deactivation of a row of memory cells of memory array(s) 110 and to use test data topology row address scrambling to write data to memory array(s) 110 in accordance with the selected data topology.

For one or more embodiments, as illustrated in FIG. 1, control circuitry 150 may receive command(s) to initiate a test and/or select a data topology from tester 180. Control circuitry 150 for one or more embodiments may comprise one or more programmable registers 152 in which one or more values may be set to place memory 101 in the identified test mode and/or to identify the selected data topology.

To write the selected data topology to memory array(s) 110, memory 101 for one or more embodiments may define one or more regions of memory cells of memory array(s) 110 that are to store common data in each of multiple rows of a region in accordance with the selected data topology. A region may have rows that are logically and/or physically contiguous and/or rows that are not logically and/or physically contiguous. By using row address scrambling to address rows of a region and retaining the common data in sense amplifiers and latches 112 across row activations for the region, memory 101 may help perform the test data topography write faster.

For blocks 204, 206, 208, 210, 212, 214, 216, and 218 of FIG. 2, memory 101 may write the same data to each of a plurality of rows of a region of memory cells of memory array(s) 110 and for block 220 may repeat operations for blocks 204–218 to write data to one or more other regions to perform the test data topography write.

For blocks 204–210, memory 101, may perform an initial write of the common data for a region to an initial row of memory cells of the region. In writing data to the initial row, memory 101 latches the data in sense amplifier and latches 112 and retains the latched data after the initial row is deactivated. Memory 101 for one or more embodiments may perform the initial write for a region in response to any suitable one or more commands from tester 180. Memory 101 for one or more embodiments may perform the initial write for a region in response to, for example, a WRITE command received while memory 101 is in a test mode.

For block 204, memory 101 may identify an initial row of memory cells of a region that is to store data common to multiple rows of memory cells in accordance with the selected data topology. For one or more embodiments, as illustrated in FIG. 1, control circuitry 150 may control addressing circuitry 120 to issue an address identifying the initial row of a region in accordance with the selected data topology. Addressing circuitry 120 for one or more embodiments may generate the address under control of control circuitry 150. Addressing circuitry 120 for one or more embodiments may generate the address in response to an address received from tester 180 in connection with a command.

For block 206, memory 101 may activate the initial row of memory cells of the region. For one or more embodiments, as illustrated in FIG. 1, control circuitry 150 may control address decoding circuitry 130 to decode an address issued from addressing circuitry 120 to activate the initial row.

For block 208, memory 101 may latch common data for the region in sense amplifiers and latches 112 and may write the common data to the initial row of memory cells of the region. For one or more embodiments, as illustrated in FIG. 1, control circuitry 150 may control data I/O circuitry 140 to transmit the data to sense amplifiers and latches 112 to latch the data and to write the data to the initial row of memory cells of the region. Data I/O circuitry 140 for one or more embodiments may generate the data under control of control circuitry 150. Data I/O circuitry 140 for one or more embodiments may receive the data from tester 180 in connection with a command.

For block 210, memory 101 may deactivate the initial row of memory cells of the region while retaining latched common data in sense amplifiers and latches 112. For one or more embodiments, as illustrated in FIG. 1, control circuitry 150 may control addressing circuitry 120 and address decoding circuitry 130 to deactivate the initial row of memory cells of the region. Control circuitry 150 for one or more embodiments may automatically deactivate the initial row of memory cells of the region after the write is performed for block 208. Control circuitry 150 for one or more embodiments may deactivate the initial row of memory cells of the region in response to one or more commands, such as a PRECHARGE command for example, from tester 180.

Memory 101 for blocks 212–218 may perform one or more subsequent writes of common data for the region to one or more other rows of memory cells of the region. By retaining latched data from the initial write to the initial row of memory cells of the region, memory 101 for one or more embodiments may perform one or more subsequent writes of latched data by activating one or more other rows of memory cells of the region. Memory 101 for one or more embodiments may perform a subsequent write for a region in response to any suitable one or more commands from tester 180. Memory 101 for one or more embodiments may perform a subsequent write for a region in response to, for example, an activate, refresh, or WRITE command received while memory 101 is in a test mode.

For block 212, memory 101 may identify a next row of memory cells of the region in accordance with a predetermined row addressing sequence for the selected data topology. For one or more embodiments, as illustrated in FIG. 1, control circuitry 150 may control addressing circuitry 120 to issue an address identifying a next row of the region in accordance with the predetermined row addressing sequence. Addressing circuitry 120 for one or more embodiments may generate the address under control of control circuitry 150. Addressing circuitry 120 for one or more embodiments may generate the address in response to an address received from tester 180 in connection with a command.

For block 214, memory 101 may activate the identified next row of memory cells of the region to write common data latched in sense amplifiers and latches 112 to the identified next row of memory cells of the region. For one or more embodiments, as illustrated in FIG. 1, control circuitry 150 may control address decoding circuitry 130 to decode an address issued from addressing circuitry 120 to activate the identified next row.

For block 216, memory 101 may deactivate the identified next row of memory cells of the region while retaining latched common data in sense amplifiers and latches 112. For one or more embodiments, as illustrated in FIG. 1, control circuitry 150 may control addressing circuitry 120 and address decoding circuitry 130 to deactivate the identified next row of memory cells of the region. Control circuitry 150 for one or more embodiments may automatically deactivate the identified next row of memory cells of the region after the write is performed for block 214. Control circuitry 150 for one or more embodiments may deactivate the identified next row of memory cells of the region in response to one or more commands, such as a PRECHARGE command for example, from tester 180.

If, for block 218, another row of memory cells of the region is to be written with data latched in sense amplifiers and latches 112, memory 101 may repeat operations for blocks 212–216 for the other row. Memory 101 for one or more embodiments may repeat operations for blocks 212–216 for all rows of the region.

If, for block 220, rows of another region of memory cells are to be written for the selected data topology, memory 101 may repeat operations for blocks 204–218 for the other region. The common data pattern for one region of memory cells may or may not differ from that for another region for the selected data topology.

Memory 101 for one or more embodiments may perform operations for blocks 202–220 for one segment of memory array(s) 110 and may repeat operations for blocks 202–220, as identified for block 222, for one or more other segments of memory array(s) 110. The selected data topography for one segment may or may not be the same as that for another segment.

Row Address Scrambling

Figure 3:
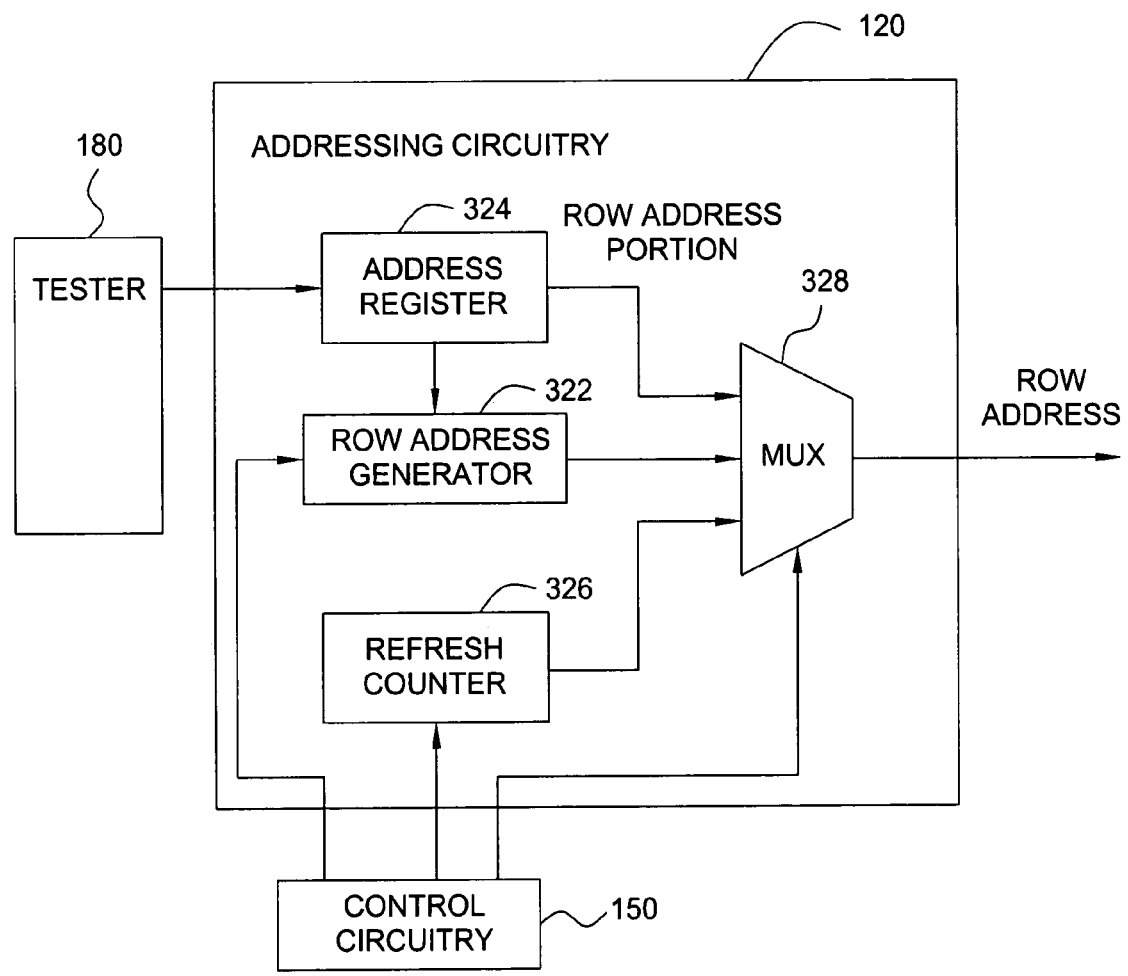
FIG. 3 illustrates, for one or more embodiments, addressing circuitry that supports test data topology row address scrambling.

FIG. 3 illustrates, for one or more embodiments, circuitry for addressing circuitry 120 to support test data topography row address scrambling. As illustrated in FIG. 3, addressing circuitry 120 may comprise a row address generator 322 to generate row addresses to help write common data latched in sense amplifiers and latches 112 to multiple rows of memory cells of memory array(s) 110 in accordance with a selected data topology. Row address generator 322 for one or more embodiments may generate row addresses in accordance with a predetermined addressing sequence for the selected data topology. Because row address generator 322 itself generates row addresses for writing test data topologies to memory array(s) 110, tester 180 for one or more embodiments may test memory 101 with reduced or minimized concern for addressing memory array(s) 110 to perform test data topology writes.

Row address generator 322 may comprise any suitable circuitry to generate row addresses for a selected data topology. Row address generator 322 for one or more embodiments may use one or more lookup tables to generate row addresses for one or more data topologies. Such lookup table(s) for one or more embodiments may be programmable to allow memory 101 to be programmed to write any suitable one or more data topologies to memory array(s) 110. Row address generator 322 for one or more embodiments may be hardwired to generate row addresses for one or more data topologies. For one or more embodiments, as illustrated in FIG. 3, control circuitry 150 may control row address generator 322 to generate row addresses for issuance to address decoding circuitry 130.

Addressing circuitry 120 for one or more embodiments, as illustrated in FIG. 3, may also comprise an address register 324, a refresh counter 326, and a multiplexer (MUX) 328 coupled to selectively output a row address from row address generator 322, address register 324, or refresh counter 326 to address decoding circuitry 130 under control of control circuitry 150.

Address register 324 may be coupled to receive an address from any suitable external circuitry, such as tester 180 for example, and may be coupled to output a row address portion of an address in address register 324 to MUX 328, for example, for a read or write access to memory array(s) 110. Refresh counter 326 may be coupled to output a row address to refresh a row of memory cells of memory array(s) 110 under control of control circuitry 150.

Figure 4:
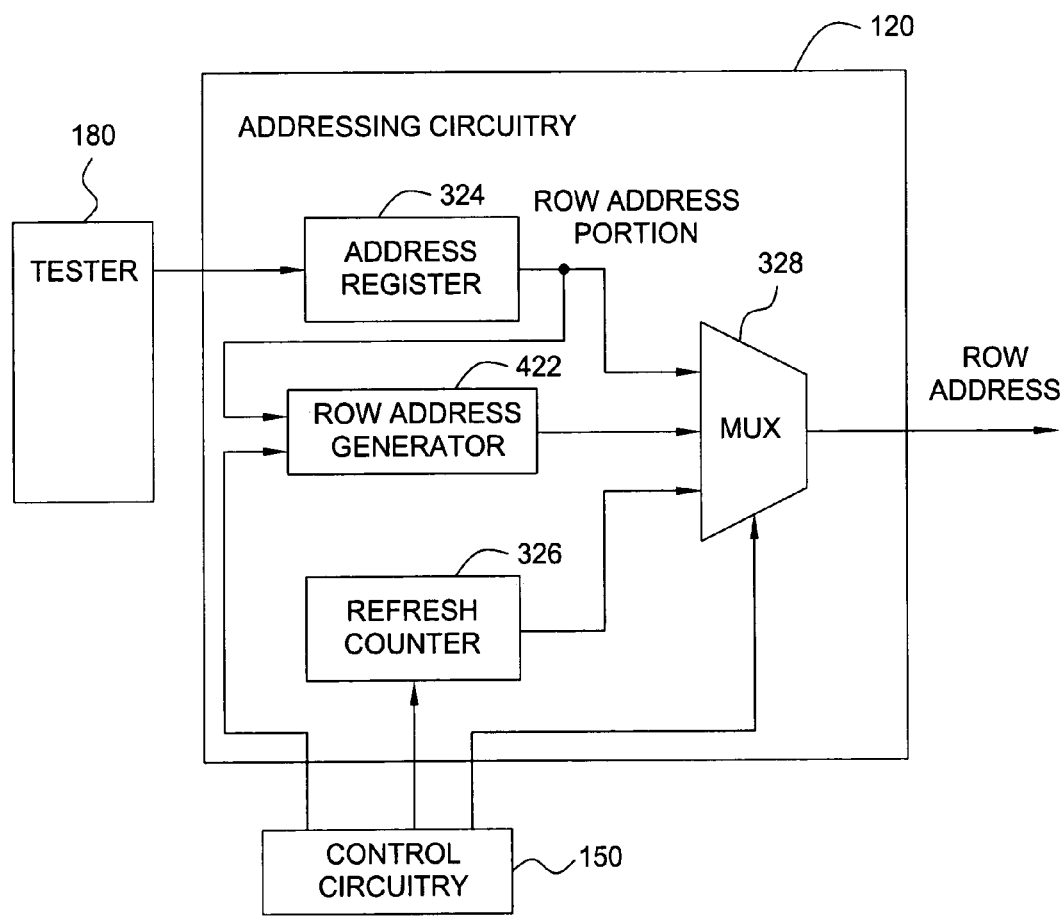
FIG. 4 illustrates, for one or more other embodiments, addressing circuitry that supports test data topology row address scrambling.

FIG. 4 illustrates, for one or more other embodiments, circuitry for addressing circuitry 120 comprising a row address generator 422 coupled to receive a row address portion of an address from address register 324 to generate a row address in response to the received row address portion. Row address generator 422 for one or more embodiments may generate row addresses in accordance with a predetermined addressing sequence for a selected data topology. By generating row addresses in response to row address portions of addresses received from tester 180, row address generator 422 helps allow tester 180 to use commands associated with addresses, such as a WRITE command, an ACTIVATE command, or a RAS-only refresh command for example, to help control test data topology writes. As one example, row address generator 422 may generate row addresses corresponding to rows 0, 3, 4, and 7 in response to receiving row address portions corresponding to rows 0, 1, 2, and 3, respectively.

Row address generator 422 may comprise any suitable circuitry to generate a row address in response to a received row address portion. Row address generator 422 for one or more embodiments may use one or more lookup tables to generate row addresses for one or more data topologies. Such lookup table(s) for one or more embodiments may be programmable to allow memory 101 to be programmed to write any suitable one or more data topologies to memory array(s) 110. Row address generator 422 for one or more embodiments may be hardwired to generate row addresses for one or more data topologies.

Row address generator 422 for one or more embodiments may generate row addresses in accordance with a predetermined addressing sequence for a selected data topology independent of the value of received row address portions. Row address generator 422 for one or more embodiments may generate row addresses for a selected data topology dependent on the value of received row address portions.

Figure 5:
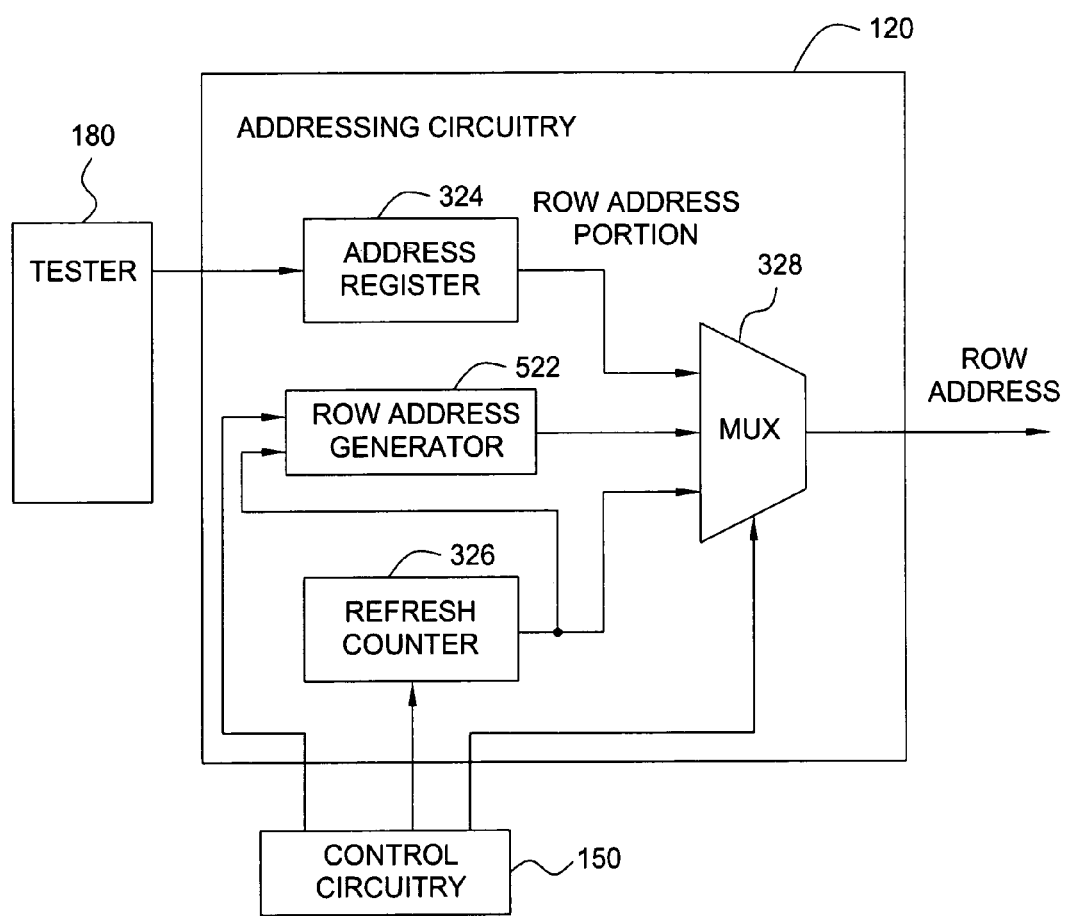
FIG. 5 illustrates, for one or more other embodiments, addressing circuitry that supports test data topology row address scrambling.

FIG. 5 illustrates, for one or more other embodiments, circuitry for addressing circuitry 120 comprising a row address generator 522 coupled to receive a row address from refresh counter 326 to generate a row address in response to the received row address. Row address generator 522 for one or more embodiments may generate row addresses in accordance with a predetermined addressing sequence for a selected data topology. By generating row addresses in response to refresh row addresses, row address generator 522 helps allow tester 180 to use a refresh command, such as a CAS-before-RAS (CBR) refresh command for example, to help control test data topology writes.

Row address generator 522 may comprise any suitable circuitry to generate a row address in response to a received refresh row address. Row address generator 522 for one or more embodiments may use one or more lookup tables to generate row addresses for one or more data topologies. Such lookup table(s) for one or more embodiments may be programmable to allow memory 101 to be programmed to write any suitable one or more data topologies to memory array(s) 110. Row address generator 522 for one or more embodiments may be hardwired to generate row addresses for one or more data topologies.

Although not illustrated in FIGS. 3, 4, and 5, addressing circuitry 120 may also comprise any suitable circuitry to generate column addresses for access to memory cells of memory array(s) 110.

Example Test Data Topology Writes

Figure 6:
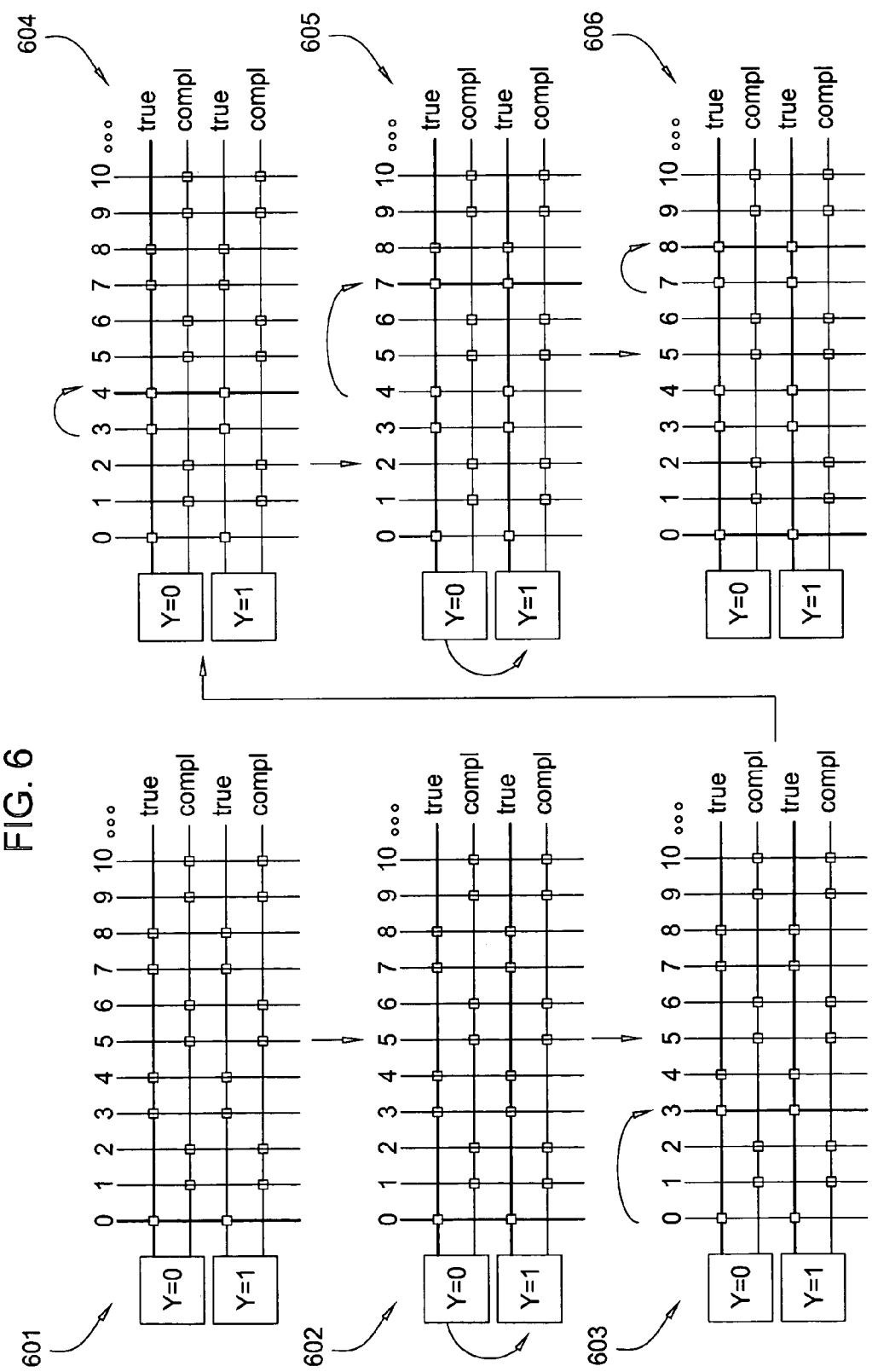
FIG. 6 illustrates, for one or more embodiments, an example sequence of cell field extracts in which common data is written to multiple rows of memory cells.

FIG. 6 illustrates, for one or more embodiments, a sequence of cell field extracts 601, 602, 603, 604, 605, and 606 in which common data is written to multiple rows of memory cells of a region in accordance with a test data topology. Cell field extracts 601–602 illustrate an initial write of common data to sequentially addressed memory cells of a row 0. Cell field extracts 603–606 illustrate subsequent writes (e.g., on subsequent refreshes, activates, etc.) of the common data to memory cells of rows 3, 4, 7, and 8, respectively. Because the common data is retained in sense amplifier latches after the initial write to row 0, the common data is written to rows 3, 4, 7, and 8 upon activation of those rows.

FIGS. 7–10 illustrate sequentially writing data patterns according to different topologies in accordance with embodiments of the present invention. As illustrated, the number of regions, as well as the particular rows in each region depend on the data topology selected (and the particular bit line architecture shown). Illustratively, the physical location of cells relative to the twist region is determined by row address bit 9 (RA<9>). Because the connections of the rows (wordlines) "before" and "after" the twist are connected to the array differently, four regions may be needed in some cases.

Figure 7:
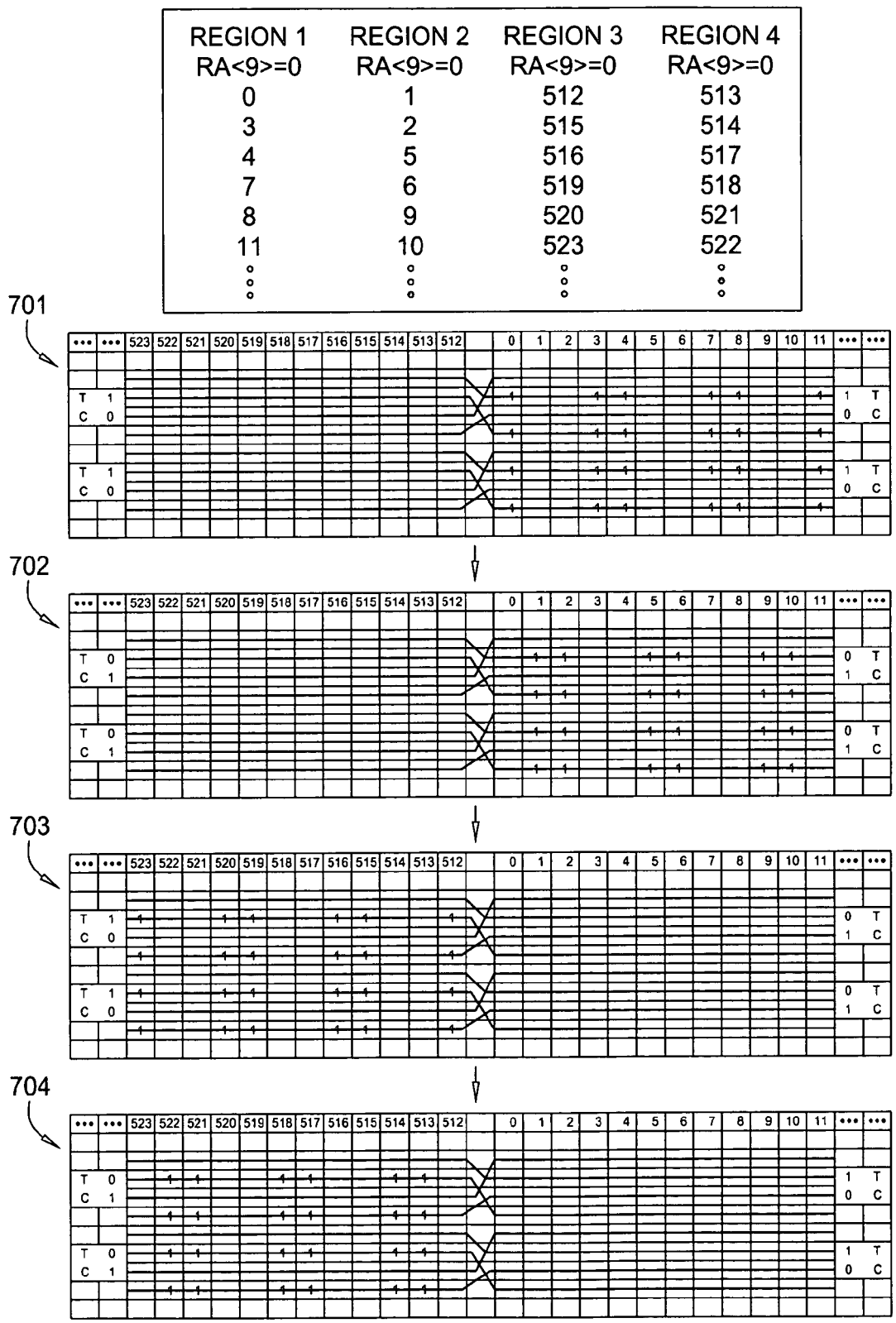
FIG. 7 illustrates, for one or more embodiments, an example sequence of cell field extracts in which common data is written to multiple rows of different regions in accordance with a physical solid data topology.

FIG. 7 illustrates, for one or more embodiments, a sequence of cell field extracts 701, 702, 703, and 704 in which common data is written to multiple rows of different regions in a folded-bitline memory architecture in accordance with a physical solid data topology (1111). Cell field extract 701 illustrates writes of common data to rows 0, 3, 4, 7, 8, and 11 of a first region. Cell field extract 702 illustrates writes of common data to rows 1, 2, 5, 6, 9, and 10 of a second region. Cell field extract 703 illustrates writes of common data to rows 12, 15, 16, 19, 20, and 23 of a third region. Cell field extract 704 illustrates writes of common data to rows 13, 14, 17, 18, 21, and 22 of a fourth region.

Figure 8:
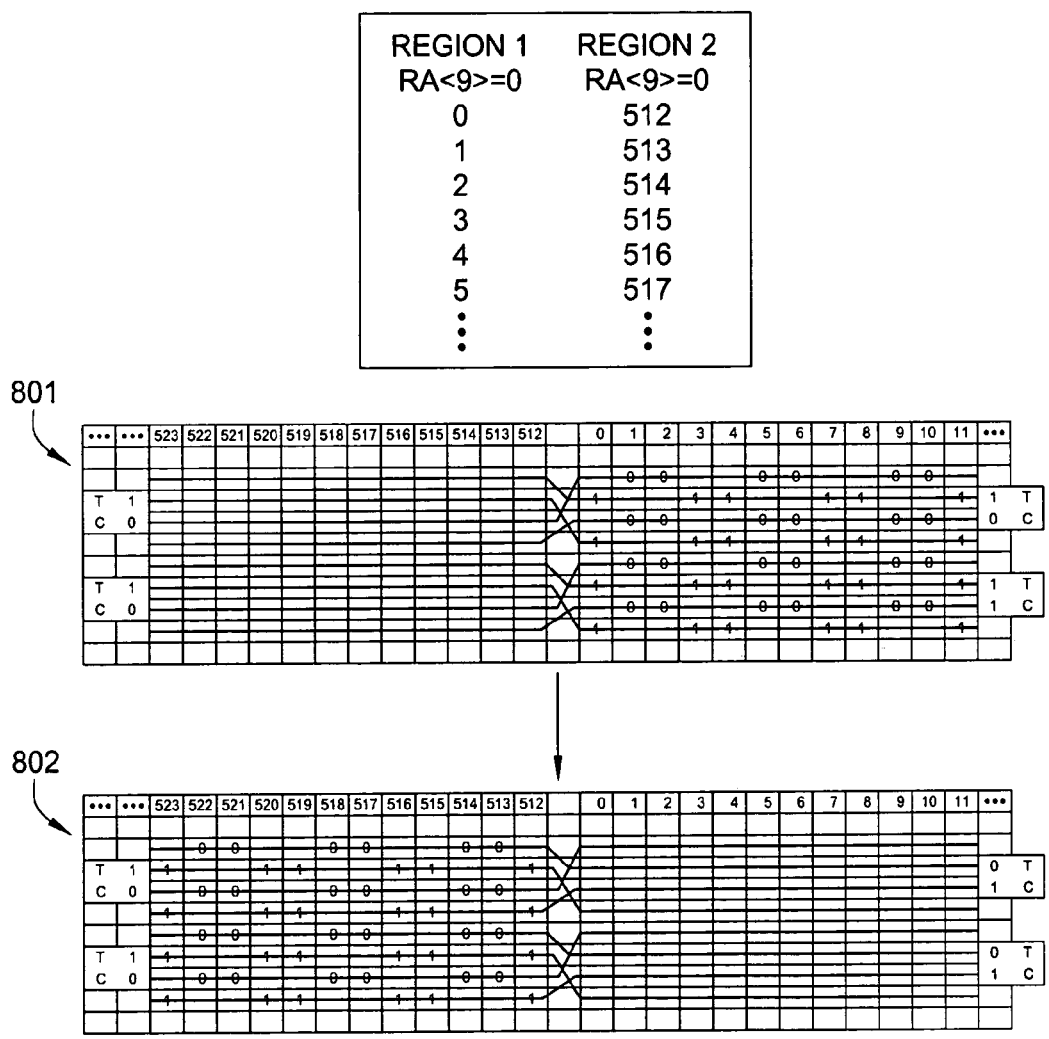
FIG. 8 illustrates, for one or more embodiments, an example sequence of cell field extracts in which common data is written to multiple rows of different regions in accordance with a row-9-double stripe data topology.

FIG. 8 illustrates, for one or more embodiments, a sequence of cell field extracts 801 and 802 in which common data is written to multiple rows of different regions in a folded-bitline memory architecture in accordance with a row-9-double stripe data topology (1001). Cell field extract 801 illustrates writes of common data to rows 0, 1, 2, 3, 4, 5, 6, 7, 8, 9, 10, and 11 of a first region. Cell field extract 802 illustrates writes of common data to rows 12, 13, 14, 15, 16, 17, 18, 19, 20, 21, 22, and 23 of a second region.

FIG. 9 illustrates, for one or more embodiments, a sequence of cell field extracts 901, 902, 903, and 904 in which common data is written to multiple rows of different regions in a folded-bitline memory architecture in accordance with a row-C-double stripe data topology (1100). Cell field extract 901 illustrates writes of common data to rows 0, 2, 4, 6, 8, and 10 of a first region. Cell field extract 902 illustrates writes of common data to rows 1, 3, 5, 7, 9, and 11 of a second region. Cell field extract 903 illustrates writes of common data to rows 12, 14, 16, 18, 20, and 22 of a third region. Cell field extract 904 illustrates writes of common data to rows 13, 15, 17, 19, 21, and 23 of a fourth region.

FIG. 10 illustrates, for one or more embodiments, a sequence of cell field extracts 1001, 1002, 1003, and 1004 in which common data is written to multiple rows of different regions in a folded-bitline memory architecture in accordance with a row-single stripe data topology (1010). Cell field extract 1001 illustrates writes of common data to rows 0, 1, 4, 5, 8, and 9 of a first region. Cell field extract 1002 illustrates writes of common data to rows 2, 3, 6, 7, 10, and 11 of a second region. Cell field extract 1003 illustrates writes of common data to rows 12, 13, 16, 17, 20, and 21 of a third region. Cell field extract 1004 illustrates writes of common data to rows 14, 15, 18, 19, 22, and 23 of a fourth region.

CONCLUSION

Embodiments of the invention generally providing writing data to memory in accordance with a test data topology using latched sense amplifier data and row address scrambling have therefore been described.

While the foregoing is directed to embodiments of the present invention, other and further embodiments of the invention may be devised without departing from the basic scope thereof, and the scope thereof is determined by the claims that follow.

What is claimed is:

1. A method for writing data to memory in accordance with a test data topology, the method comprising:
    writing data into an initial row of memory cells, wherein the writing data comprises latching data in a plurality of sense amplifier latches;
    deactivating the initial row of memory cells while retaining the latched data in the sense amplifier latches;
    identifying another row of memory cells in accordance with a predetermined row addressing sequence for the test data topology; and
    activating the other row of memory cells to write the retained latched data to the other row.

2. The method of claim 1, comprising receiving from a tester a command identifying the test data topology.

3. The method of claim 1, wherein the identifying comprises identifying an address identifying the other row of memory cells in response to an address received from a tester.

4. The method of claim 1, wherein the identifying comprises identifying an address identifying the other row of memory cells in response to a refresh address.

5. The method of claim 1, wherein the activating is performed in response to a write, activate, or refresh command received from a tester.

6. A method for writing data to memory in accordance with a test data topology, the method comprising:
    writing data into an initial row of memory cells of a region of memory cells, wherein the writing data comprises latching data in a plurality of sense amplifier latches;
    deactivating the initial row of memory cells while retaining the latched data in the sense amplifier latches;
    identifying another row of memory cells of the region in accordance with a predetermined row addressing sequence for the test data topology;
    activating the other row of memory cells of the region to write the retained latched data to the other row;
    deactivating the other row of memory cells while retaining the latched data in the sense amplifier latches; and
    repeating the identifying, activating, and deactivating of another row of memory cells of the region.

7. The method of claim 1, comprising:
    performing the writing, deactivating, identifying, activating, deactivating, and repeating for multiple regions of memory cells.

8. An apparatus comprising:
    one or more memory arrays having memory cells;
    means for writing data for a test data topology into an initial row of memory cells;
    means for deactivating the initial row of memory cells while retaining the data;
    means for identifying another row of memory cells in accordance with a predetermined row addressing sequence for the test data topology; and
    means for activating the other row of memory cells to write the retained data to the other row.

* * * * *